(12) United States Patent
Lee et al.

(10) Patent No.: US 8,807,025 B2
(45) Date of Patent: Aug. 19, 2014

(54) MESH FOR SCREEN PRINTING AND METHOD OF FORMING PATTERNS USING THE MESH FOR SCREEN PRINTING

(75) Inventors: Seung-Jun Lee, Yongin (KR);
Jeong-Geun Yoo, Yongin (KR);
Sung-Min Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 390 days.

(21) Appl. No.: 13/137,971

(22) Filed: Sep. 22, 2011

(65) Prior Publication Data
US 2012/0199023 A1 Aug. 9, 2012

(30) Foreign Application Priority Data

Feb. 8, 2011 (KR) .................. 10-2011-0011112

(51) Int. Cl.
*B05C 17/06* (2006.01)
*B41M 1/12* (2006.01)
*H05K 3/12* (2006.01)

(52) U.S. Cl.
CPC ............... *H05K 3/1225* (2013.01); *B41M 1/12* (2013.01)
USPC .......................... 101/127; 101/129; 118/301

(58) Field of Classification Search
CPC .......... B41F 15/34; B41F 15/36; B41F 15/42; B41C 1/14; B41C 1/141; B41C 1/145
USPC .................. 101/114, 127, 128.21, 128.4, 129; 118/301, 504
See application file for complete search history.

(56) References Cited

U.S. PATENT DOCUMENTS

| | | | | |
|---|---|---|---|---|
| 2,095,909 | A | * 10/1937 | Bennett | ........................... 355/77 |
| 4,134,339 | A | * 1/1979 | Iten | ................................ 101/127 |
| RE41,604 | E | 8/2010 | Ashworth | |
| 2008/0220341 | A1* | 9/2008 | Fu et al. | ............................ 430/5 |
| 2009/0114436 | A1* | 5/2009 | Chen et al. | ..................... 174/263 |

FOREIGN PATENT DOCUMENTS

| | | |
|---|---|---|
| EP | 0164149 A1 | 12/1985 |
| JP | 1997-226265 A | 9/1997 |
| JP | 2010-023253 A | 2/2010 |
| JP | 2012227466 A * | 11/2012 |
| KR | 91-0007077 B1 | 9/1991 |
| KR | 10-0643044 B1 | 10/2006 |

* cited by examiner

*Primary Examiner* — Ren Yan
(74) *Attorney, Agent, or Firm* — Lee & Morse, P.C.

(57) ABSTRACT

A screen printing mesh including a plurality of octagonal first openings and a plurality of polygonal second openings, each of the second openings being disposed between the first openings, wherein an inner angle between a first line segment of each of the second openings and an adjacent second line segment is 90 degrees or greater.

20 Claims, 7 Drawing Sheets

MESH FOR SCREEN PRINTING AND METHOD OF FORMING PATTERNS USING THE MESH FOR SCREEN PRINTING

CROSS-REFERENCE TO RELATED PATENT APPLICATION

This application claims the benefit of Korean Patent Application No. 10-2011-0011112, filed on Feb. 8, 2011, in the Korean Intellectual Property Office, the disclosure of which is incorporated herein in its entirety by reference.

BACKGROUND

1. Field of the Invention

The present invention relates to a mesh for screen printing and method of forming patterns using the mesh for screen printing.

2. Description of the Related Art

A screen printing method is a method of forming patterns by fixing a screen printing mesh having a plurality of openings using a frame, and transferring a conductive paste onto a substrate while pressing a squeegee against patterns of a pattern film disposed between the screen printing mesh and the substrate.

Here, the conductive paste passes through the openings of the screen printing mesh; however, the conductive paste may not be uniformly transferred in areas where line boundaries of the openings intersect with one another.

SUMMARY

One or more embodiments may provide a screen printing mesh including a plurality of octagonal first openings and a plurality of polygonal second openings, each of the second openings being disposed between the first openings, wherein an inner angle between a first line segment of each of the second openings and an adjacent second line segment is 90 degrees or greater.

The first openings and the second openings may be alternately arranged in a first direction.

The first openings and the second openings may be alternately arranged in a second direction that is perpendicular to the first direction.

The first openings and the second openings may be symmetrically arranged in a first direction and in a second direction that is perpendicular to the first direction.

Each of the first openings may be vertically aligned with a first alignment of second openings and horizontally aligned with a second alignment of second openings. The first openings may have a regular octagonal shape. The second openings may have a regular shape. The regular shape may be a square shape.

An area of the first openings may be greater than an area of the second openings. A boundary portion of each of the first openings may have a uniform line width. A boundary portion of each of the second openings may have a uniform line width. The line width of the boundary portion of each of the first openings and the line width of the boundary portion of each of the second openings may be the same. Each of the second openings may share a boundary portion with an adjacent first opening.

One or more embodiments may provide a method of forming a pattern using a screen printing mesh, the method including providing a screen printing mesh described above, mounting the screen printing mesh to a frame by tensioning the screen printing mesh, coating the screen printing mesh with a paste, and forming a pattern by transferring the paste onto the substrate by moving a squeegee on the screen printing mesh.

Tensioning the screen printing mesh may include slanting the patterns of the first openings and second openings of the screen printing mesh. The paste may include a conductive ink. The substrate may be a printed circuit board including wirings.

The method may further include forming a pattern corresponding to the wirings, between the screen printing mesh and the printed circuit board using a pattern film. The patterns of the first openings and the second openings may be tilted in a first tensioning direction of the frame, and the patterns of the pattern film may be aligned parallel to the first tensioning direction of the frame.

The squeegee may be moved along the first tensioning direction.

BRIEF DESCRIPTION OF THE DRAWINGS

The above and other features and advantages of embodiments will become more apparent by describing in detail exemplary embodiments thereof with reference to the attached drawings in which.

DETAILED DESCRIPTION

Embodiments will now be described more fully with reference to the accompanying drawings, in which exemplary embodiments of the invention are shown.

Figure 1:
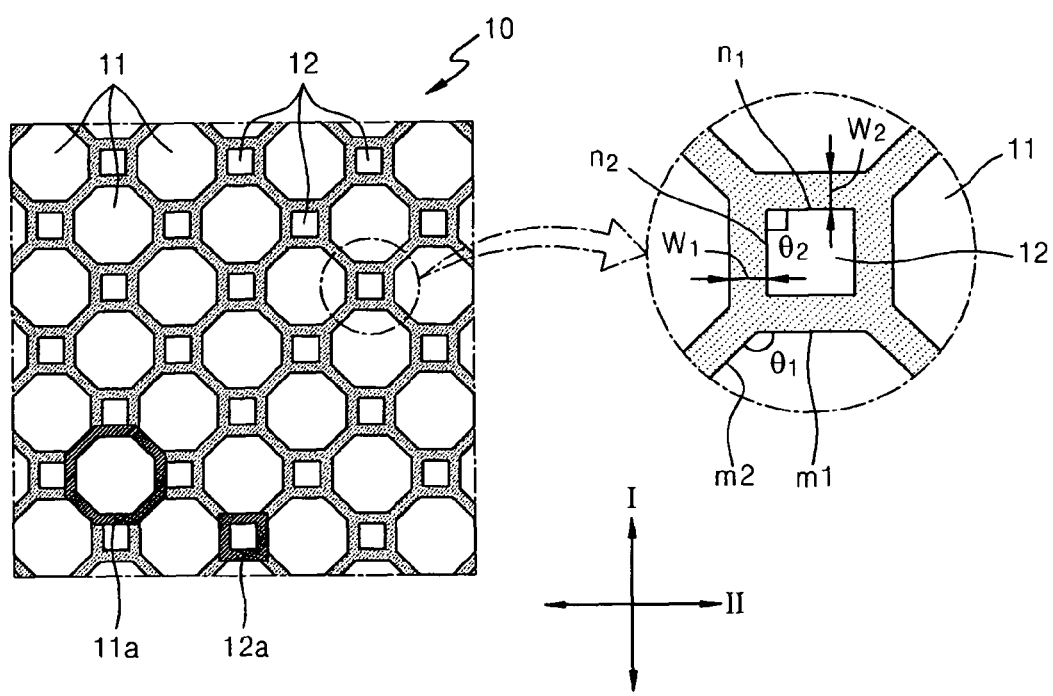
FIG. 1 illustrates a schematic view of a screen printing mesh according to an embodiment.

FIG. 1 illustrates a schematic view of a screen printing mesh 10 according to an embodiment.

Referring to FIG. 1, the screen printing mesh 10 may include a plurality of first openings 11 and a plurality of second openings 12 disposed between the first openings 11. The plurality of first openings 11 may be generally octagonal.

The first openings 11 and the second openings 12 may be alternately arranged in a first direction I. Also, the first openings 11 and the second openings 12 may be alternately arranged in a second direction II that is perpendicular to the first direction I.

The first openings 11 and the second openings 12 may be symmetrically arranged with respect to the first direction I and the second direction II. A boundary portion 11a of each of the first openings 11 and a boundary portion 12a of each of the second openings 12 may be in linear contact along the first direction I and the second direction II. According to an embodiment, each of the first openings 11 may be vertically aligned with a first alignment of second openings 12. According to an embodiment, each of the first openings 11 may be horizontally aligned with a second alignment of second openings 12. For example, at least one side of the second opening 12, e.g., each side, may correspond to a side of a first opening 11.

An area of the first openings 11 may be larger than an area of the second openings 12.

The first openings 11 may be octagonal. In particular, the first openings 11 may have a regular octagonal shape. If the first openings 11 are in a regular octagonal shape, an inner angle θ1 between a first line segment m1 of each of the first openings 11 and a second line segment m2 adjacent to the first line segment m1 may be 135 degrees. The boundary portion 11a of the first openings 11 may have a uniform line width w1.

The second openings 12 may be polygonal such that an inner angle θ2 between a first line segment n1 and a second line segment n2 adjacent to the first line segment n1 is 90 degrees or greater. Referring to FIG. 1, the second openings 12 may have a regular shape. For example, the second openings 12 may have a generally square shape with inner angles θ2 of 90 degrees, but embodiments are not limited thereto. For example, the second openings 12 may have a rectangular shape. The boundary portion 12a of the second openings 12 may have a uniform line width w2.

The boundary portions 12a of the second openings 12 may share boundary portions 11a with adjacent first openings 11. For example, each of the boundary portions 12a of the second openings 12 may form part of the boundary portion 11a of an adjacent first opening 11. Also, the line width w1 of the boundary portion 11a of the first openings 1 and the line width w2 of the boundary portion 12a of the second openings 12 may be the same.

Figure 2A:
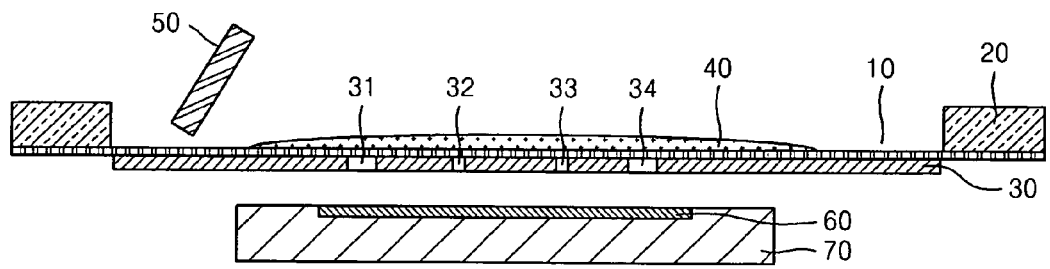
FIGS. 2A through 2C illustrate cross-sectional views of a method of forming a pattern using a screen printing mesh, according to an embodiment.
Figure 2B:
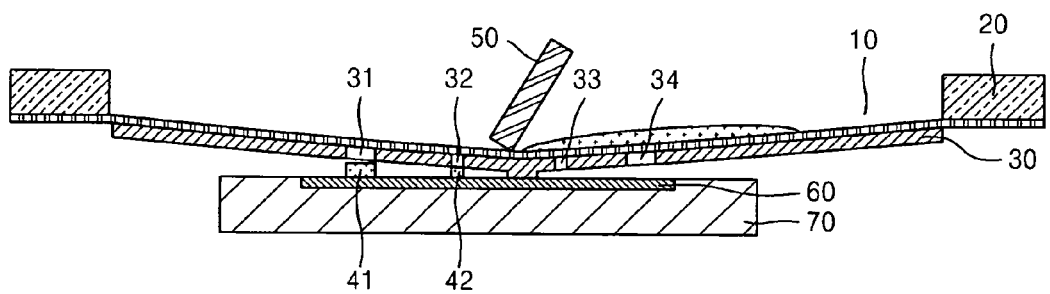
Figure 2C:
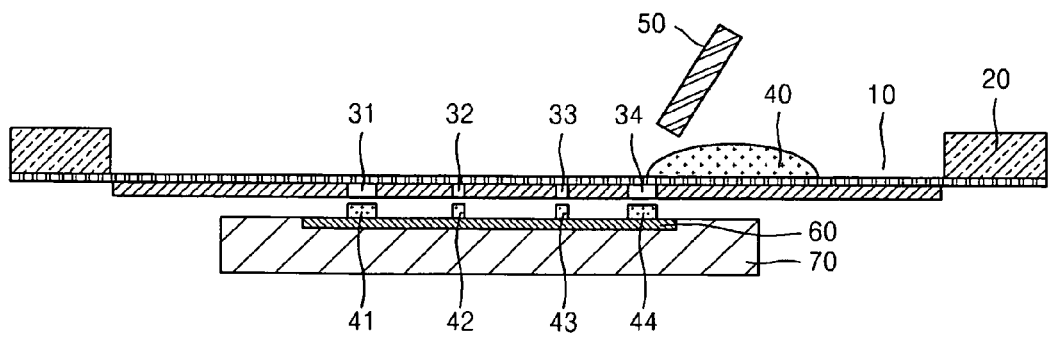

FIGS. 2A through 2C illustrate cross-sectional views of a method of forming a pattern using the screen printing mesh 10 according to an embodiment.

Referring to FIG. 2A, the screen printing mesh 10 may be tensioned by and mounted to a frame 20. A substrate 60 to which a pattern is to be transferred may be mounted on a support 70. The substrate 60 may be a flexible printed circuit board (FPCB).

A pattern film 30, having a plurality of openings 31, 32, 33, and 34, through which a pattern is to be transferred, may be further disposed between the screen printing mesh 10 and the substrate 60.

A paste 40 may be coated on the screen printing mesh 10. The paste 40 may be a conductive paste such as a conductive ink, and the conductive paste may be used as a wiring of a FPCB.

Referring to FIGS. 2B and 2C, the paste 40 may be transferred on the substrate 60 while moving a squeegee 50 on the screen printing mesh 10 to form patterns 41, 42, 43, and 44.

In order to increase uniformity of the transferred patterns 41, 42, 43, and 44, the operations described with reference to FIGS. 2A through 2C may be repeated.

Figure 3:
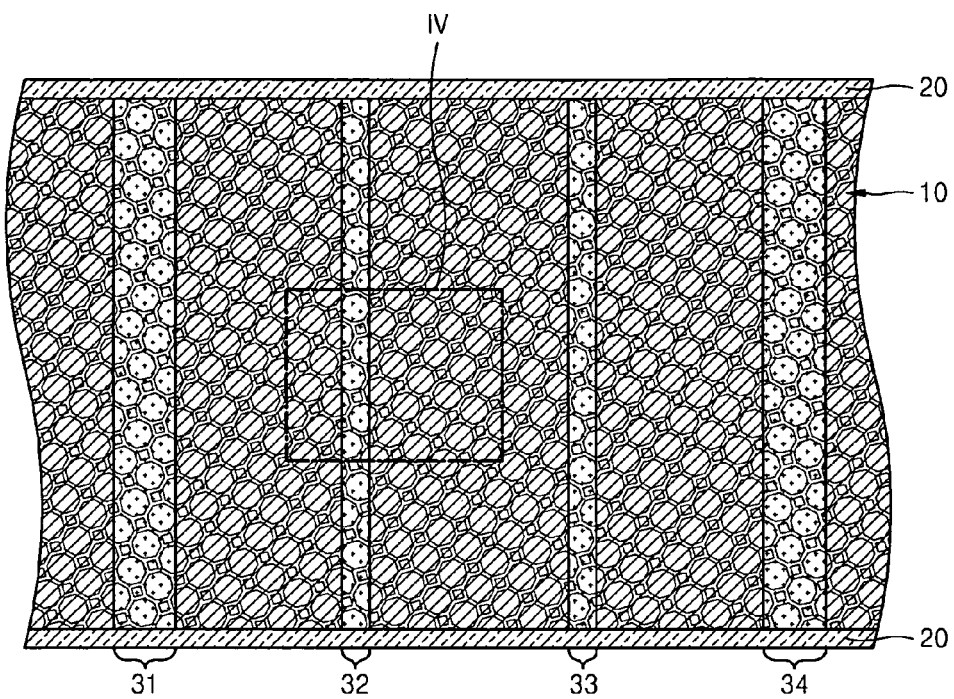
FIG. 3 illustrates a schematic view of a screen printing mesh according to an embodiment mounted to a frame, and a pattern film.
Figure 3:
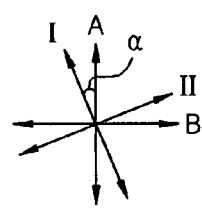
Figure 4:
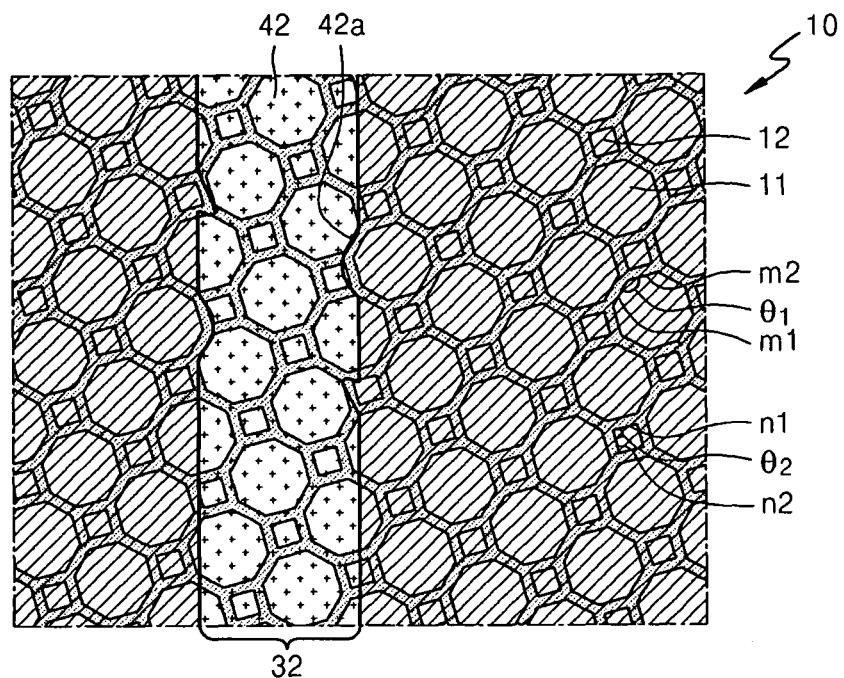
FIG. 4 illustrates an expanded view of a portion IV of FIG. 3.
Figure 5:
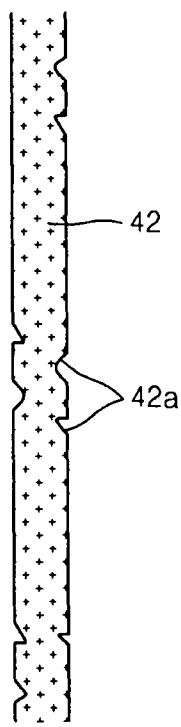
FIG. 5 illustrates a schematic view of a pattern transferred using an embodiment.

FIG. 3 illustrates a schematic view of the screen printing mesh 10 according to an embodiment mounted to the frame 20 and the pattern film 30. FIG. 4 illustrates an expanded view of a portion IV of FIG. 3. FIG. 5 illustrates a schematic view of the pattern 42 transferred to the substrate 60 according to an embodiment.

Referring to FIGS. 3 and 4, the screen printing mesh 10 may be tensioned in a third direction A and a fourth direction B that is perpendicular to the third direction A, to be mounted to the frame 20.

When the first openings 11 having a regular octagonal shape are included, an inner angle θ1 between the first line segment m1 of the first openings 11 and the second line segment m2 adjacent to the first line segment m1 may be 135 degrees.

Figure 6:
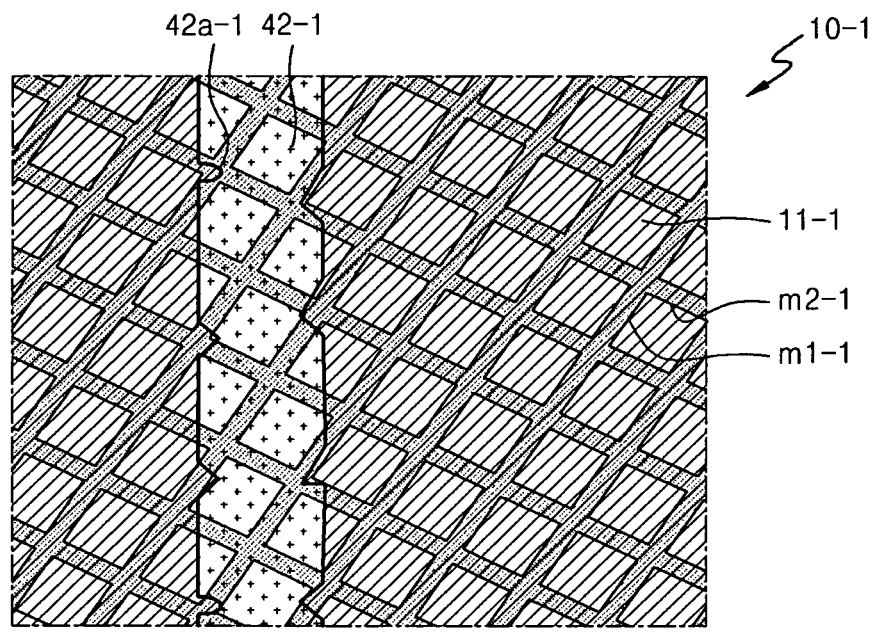
FIG. 6 illustrates a schematic view of a screen printing mesh according to a comparative example and a pattern film.
Figure 7:
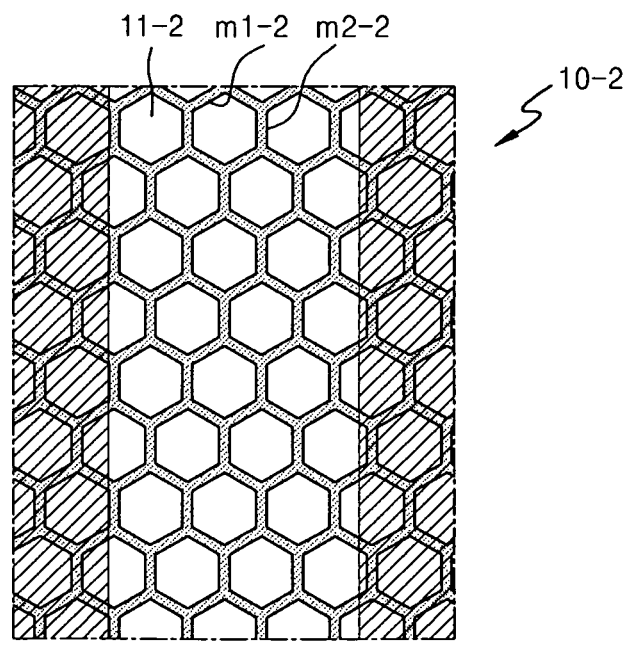
FIG. 7 is a schematic view illustrating a relationship between a screen printing mesh according to another comparative example and a pattern film.

FIG. 6 illustrates a schematic view of a screen printing mesh 10-1, according to a comparative example, mounted between a frame and a pattern film. FIG. 7 illustrates a schematic view of a screen printing mesh 10-2, according to another comparative example, mounted between a frame and a pattern film.

Referring to FIG. 6, if first openings 11-1 of the screen printing mesh 10-1 are regular squares, an inner angle between a first line segment m1-1 of the first openings 11-1 and a second line segment m1-2 adjacent to the first line segment m1-1 may be 90 degrees.

Also, referring to FIG. 7, if first openings 11-2 of the screen printing mesh 10-2 are hexagonal, an inner angle between a first line segment m1-2 of the first openings 11-2 and a second line segment m2-2 adjacent to the first line segment m1-2 may be 120 degrees.

The inner angle θ1 between the first line segment m1 of each of the first openings 11 and the second line segment m2 adjacent to the first line segment m1 of the screen printing mesh 10 according to an embodiment, may be greater than the inner angles of the screen printing meshes 10-1 or 10-2, according to the comparative examples in which the first openings 11-1 and 11-2 are square-shaped or hexagonal. Thus, the paste 40 may penetrate the first openings 11 more easily than the first openings 11-1 and 11-2.

Figure 10:
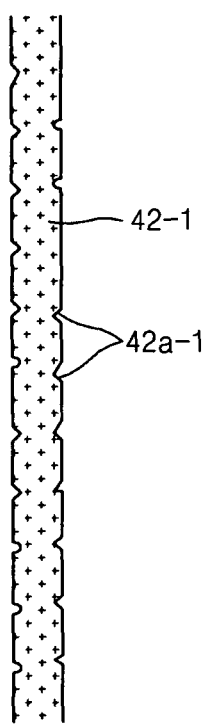
FIG. 10 is a schematic view of a pattern that is transferred using the comparative example of FIG. 6.

Referring to FIG. 5, the number of irregular patterns 42a formed on an outer boundary of the pattern 42 transferred onto the substrate 60, according to an embodiment, may be greatly reduced compared to the number of irregular patterns 42a-1 formed on an outer boundary of a pattern 42-1 transferred onto a substrate according to the comparative example, as illustrated in FIG. 10. Also, the amount of remaining paste 40 on the screen printing mesh 10 when peeling off the screen printing mesh 10 after a transferring operation may be reduced. Accordingly, outer boundary uniformity of transferred patterns may be increased.

Figure 8:
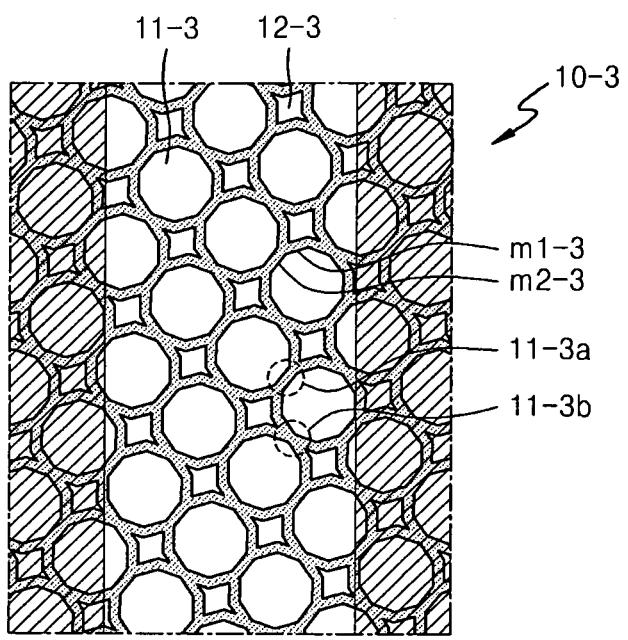
FIG. 8 is a schematic view illustrating a relationship between a screen printing mesh according to another comparative example and a pattern film.

FIG. 8 illustrates a schematic view of a screen printing mesh 10-3, according to another comparative example, and a pattern film. Referring to FIG. 8, if a first opening 11-3 of the screen printing mesh 10-3 is decagonal, an inner angle between a first line segment m1-3 of the first opening 11-3 and a second line segment m2-3 that is adjacent to the first line segment 11-3, may be greater than the inner angle θ1 of 135 degrees of the first openings 11 of the screen printing mesh 10 of an embodiment. However, manufacturing the screen printing mesh 10-3 may be more difficult than manufacturing screen printing mesh 10 of an embodiment. Also, a portion 11-3a of the first opening 11-3 which is decagonal, may be in linear contact with the first opening 11-3, and a portion 11-3b is in point contact with the first opening 11-3. Thus, when the screen printing mesh 10-3 is tensioned by and mounted to the frame 20, a tension is not uniformly distributed over the first opening 11-3. In other words, the decagonal shape of the first opening 11-3 may not facilitate sufficient tensioning of the printing mesh 10-3 by the frame 20. Accordingly, it may be difficult to form a uniform pattern of the first opening 11-3. As a result, a transfer pattern passing through the screen printing mesh 10-3 may not be formed uniformly either.

Referring to FIGS. 3 and 4, when the second openings 12 having a regular square shape are included, as described above, all of the inner angles θ2 between the first line segment n1 of each of the second openings 12 and the second line segment n2 adjacent to the first line segment n1 may be 90 degrees. On the other hand, referring to FIG. 8, in the screen printing mesh 10-3 including the decagonal first openings 11-31, second openings 12-3, disposed between the first openings 11-3, may be generally cross-shaped, having inner angles less than 90 degrees.

Figure 9:
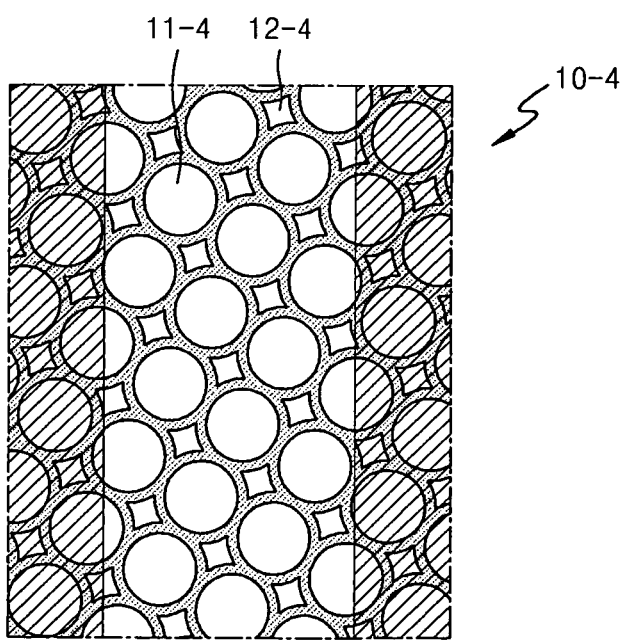
FIG. 9 is a schematic view illustrating a relationship between a screen printing mesh according to another comparative example and a pattern film.

FIG. 9 illustrates a schematic view of a screen printing mesh 10-4, according to another comparative example, and a pattern film. Referring to FIG. 9, the screen printing mesh 10-4 includes circular first openings 11-4 and second openings 12-4 disposed between the first openings 11-4, which are generally cross-shaped openings having inner angles less than 90 degrees.

If the second openings 12-3 or 12-4 are formed such that each inner angle is less than 90 degrees, as illustrated in FIGS. 8 and 9, when the screen printing mesh 10-3 or 10-4 is removed after transferring a paste, the paste may remain on boundary portions of the second openings 12-3 and 12-4. Accordingly, transfer defects may occur due to the remaining paste. Also, durability of the screen printing meshes 10-3 and 10-4 may be decreased due to the remaining paste.

Accordingly, since an inner angle between the first line segment n1 of the second opening 11 and the second line segment n2 adjacent to the first line segment n1 in the screen printing mesh 10 may be greater than 90 degrees, defects in transfer patterns due to the remaining paste and a decrease in durability of the screen printing mesh 10, may be prevented.

As shown in FIG. 3, patterns of the first opening 11 and the second opening 12 of the screen printing mesh 10 may be tilted or slanted at a predetermined angle α with respect to the directions A and B. The patterns of the first opening 11 and the second opening 12 may be slanted during, for example, tensioning of the screen printing mesh 10. A direction of patterns of the pattern film 30 may be parallel to the first direction I. Accordingly, the direction of the patterns of the pattern film 30, like the patterns of the first openings 11 and the second openings 12 of the screen printing mesh 10, may be tilted or slanted at a predetermined angle α. The paste 40 which is to be formed into the patterns 41-44, after passing through the openings 31 through 34 of the pattern film 30, may also be tilted or slanted at a predetermined angle α, with respect to the patterns of the first openings 11 and the second openings 12 of the screen printing mesh 10. The angle α may preferably be about 15 to 30 degrees. As stated above, the paste 40, which is to be formed into the patterns 41-44, may be filled in the screen printing mesh 10 that is tilted at an angle. Thus, when the paste 40 is transferred to the substrate 60, the paste 40 may easily peel off from the mesh 10.

According to an embodiment, a pattern direction of the pattern film 30 may be parallel to the first tensioning direction I, and a pattern may be transferred to the substrate 60 while moving the squeegee 50 along the first direction I (see FIGS. 2A to 2C). According to an embodiment, the patterns of the pattern film 30 may extend diagonally between opposing sides of the frame 20. According to an embodiment, the patterns of the pattern film 30 may be perpendicular to opposing sides of the frame 20.

Thus, according to the screen printing mesh and the method of forming a pattern using the screen printing mesh according to an embodiment, outer boundary uniformity of the transferred patterns may be improved, and defects in transfer patterns and decrease in durability of the screen printing mesh due to the remaining paste may be prevented. Also, as previously stated, the paste which is to be formed into the patterns, may be filled in the screen printing mesh while being tilted at an angle. Thus, after the paste is transferred to the substrate, the paste may easily peel off from the screen printing mesh.

According to the screen printing meshes and methods of forming patterns using the screen printing meshes, the following effects may be obtained.

First, outer boundary uniformity of transferred patterns may be improved.

Second, defects in the transfer patterns and decrease in durability of the screen printing mesh due to a remaining paste may be prevented.

Third, when transferring a paste to a substrate, a peeling operation of the paste from the screen printing mesh may be improved.

While embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A screen printing mesh comprising:
   a plurality of octagonal first openings; and
   a plurality of polygonal second openings that are not octagonal, at least one of the second openings being disposed between the first openings, wherein
   an inner angle between a first line segment of each of the second openings and an adjacent second line segment is 90 degrees or greater, and
   a size of each of the plurality of second openings is smaller than a size of each of the plurality of first octagonal openings.

2. The screen printing mesh of claim 1, wherein the first openings and the second openings are alternately arranged in a first direction.

3. The screen printing mesh of claim 2, wherein the first openings and the second openings are alternately arranged in a second direction that is perpendicular to the first direction.

4. The screen printing mesh of claim 2, wherein the first openings and the second openings are symmetrically arranged in a first direction and in a second direction, the second direction being perpendicular to the first direction.

5. The screen printing mesh of claim 2, wherein each of the first openings is vertically aligned with a first alignment of second openings and horizontally aligned with a second alignment of second openings.

6. The screen printing mesh of claim 1, wherein the first openings have a regular octagonal shape.

7. The screen printing mesh of claim 1, wherein the second openings have a regular shape.

8. The screen printing mesh of claim 7, wherein the regular shape is a square shape.

9. The screen printing mesh of claim 1, wherein an area of the first openings is greater than an area of the second openings.

10. The screen printing mesh of claim 1, wherein a boundary portion of each of the first openings has a uniform line width.

11. The screen printing mesh of claim 1, wherein a boundary portion of each of the second openings has a uniform line width.

12. The screen printing mesh of claim 1, wherein the line width of the boundary portion of each of the first openings and the line width of the boundary portion of each of the second openings are the same.

13. The screen printing mesh of claim 12, wherein each of the second openings share a boundary portion with an adjacent first opening.

14. A method of forming a pattern using a screen printing mesh, the method comprising:
   providing a screen printing mesh of claim 1;
   mounting the screen printing mesh to a frame by tensioning the screen printing mesh;
   coating the screen printing mesh with a paste; and
   forming a pattern by transferring the paste onto the substrate by moving a squeegee on the screen printing mesh.

15. The method of claim 14, wherein tensioning the screen printing mesh includes slanting the patterns of the first openings and second openings of the screen printing mesh.

16. The method of claim 14, wherein the paste includes a conductive ink.

17. The method of claim 16, wherein the substrate is a printed circuit board including wirings.

18. The method of claim 17, further comprising forming a pattern corresponding to the wirings, between the screen printing mesh and the printed circuit board using a pattern film.

19. The method of claim 17, wherein the patterns of the first openings and the second openings are tilted in a first tensioning direction of the frame, and the patterns of the pattern film are aligned parallel to the first tensioning direction of the frame.

20. The method of claim 19, wherein the squeegee is moved along the first tensioning direction.

* * * * *